(12) United States Patent
Smith

(10) Patent No.: US 6,846,595 B2
(45) Date of Patent: Jan. 25, 2005

(54) METHOD OF IMPROVING PHOTOMASK GEOMETRY

(75) Inventor: Bruce W. Smith, Webster, NY (US)

(73) Assignee: ASML Netherlands B.V., Veldhoven (NL)

( * ) Notice: Subject to any disclaimer, the term of this patent is extended or adjusted under 35 U.S.C. 154(b) by 52 days.

(21) Appl. No.: 10/203,793

(22) PCT Filed: Feb. 14, 2001

(86) PCT No.: PCT/US01/04838
§ 371 (c)(1),
(2), (4) Date: Nov. 25, 2002

(87) PCT Pub. No.: WO01/61412
PCT Pub. Date: Aug. 23, 2001

(65) Prior Publication Data
US 2003/0211400 A1 Nov. 13, 2003

Related U.S. Application Data

(60) Provisional application No. 60/182,367, filed on Feb. 14, 2000, and provisional application No. 60/185,046, filed on Feb. 25, 2000.

(51) Int. Cl.[7] .............................................. G03F 9/00
(52) U.S. Cl. ....................................................... 430/5
(58) Field of Search ............................ 430/5, 30, 296; 355/67; 716/19, 21

(56) References Cited

U.S. PATENT DOCUMENTS

| | | | |
|---|---|---|---|
| 5,229,255 A | 7/1993 | White | 430/311 |
| 5,242,770 A | 9/1993 | Chen et al. | 430/5 |
| 5,256,505 A | 10/1993 | Chen et al. | 430/5 |
| 5,288,569 A | 2/1994 | Lin | 430/5 |
| 5,324,600 A | 6/1994 | Jinbo et al. | 430/5 |
| 5,362,584 A | 11/1994 | Brock et al. | 430/5 |
| 5,424,154 A | 6/1995 | Borodovsky | 430/5 |
| 5,436,095 A | 7/1995 | Mizuno et al. | 430/5 |
| 5,447,810 A | 9/1995 | Chen et al. | 430/5 |
| 5,538,815 A | 7/1996 | Oi et al. | 430/5 |
| 5,663,893 A | 9/1997 | Wampler et al. | 364/491 |
| 5,707,765 A | 1/1998 | Chen | 430/5 |
| 5,723,233 A | 3/1998 | Garza et al. | 430/5 |
| 5,821,014 A | 10/1998 | Chen et al. | 430/5 |
| 5,827,623 A | 10/1998 | Ishida et al. | 430/5 |
| 5,827,625 A * | 10/1998 | Lucas et al. | 430/5 |
| 6,114,071 A | 9/2000 | Chen et al. | 430/5 |

* cited by examiner

Primary Examiner—S. Rosasco
(74) Attorney, Agent, or Firm—McDermott Will & Emery LLP

(57) ABSTRACT

Photomask manufacture is improved by adding assist bars 320, 340 for isolated features 300. The bars 320, 340 are added at a center to center spacing that corresponds to the center to center spacing for densely packed features. By matching the assist bars to the densely packed features, the combined diffraction pattern of the isolated features is modified to more closely resemble the diffraction pattern of the densely packed features.

31 Claims, 14 Drawing Sheets

Infinite isolated line diffraction energy

OPC assist at pitch separation.

FT of assist features - enveloped by Sinc<->rect(x/b) which is ideally b=0. Filtering needs a pupil filter = 1/sinc Assisted line diffraction energy.

180nm space w/o assist bars

180nm space with one pair of 60nm assist features at a pitch of λ/NA

180nm space with two pairs of 60nm assist features at a pitch of 1/2 λ/NA

180nm space with three pairs of 60nm assist features at a pitch of 1/2/3 λ/NA

METHOD OF IMPROVING PHOTOMASK GEOMETRY

RELATED APPLICATIONS

This application claims the benefit of U.S. patent application Ser. Nos. 60/182,367 filed Feb. 14, 2000 and 60/185,046 filed Feb. 25, 2000.

FIELD OF INVENTION

The present invention relates to the field of microlithography for processing of integrated circuit devices, particularly photolithographic masking and imaging.

BACKGROUND

Methods of proximity effect reduction have been introduced which are comprised of additional lines, sometimes referred to as intensity leveling bars, into a mask pattern. This is disclosed by J. F. Chen in U.S. Pat. No. 5,242,770, and its entire disclosure is incorporated by reference in this application. These leveling bars perform the function of matching edge intensity gradients of isolated features on the mask to more dense features on the mask, as shown in FIG. 1. In this figure, lines 30–34 are all designed to the same dimension and spacing. The patterning is such that line 32 experiences three separate proximity situations, one that is closely packed to lines 30, 31, 33, and 34, one that is isolated, and one that is surrounded by intensity leveling bars, 36. In the preferred embodiment of U.S. Pat. No. 5,242,770, the width of the leveling bars, 36, is equal to one fifth of the critical dimension for the line and the separation of leveling bar 36 from the line 32, as defined by the edge to edge distance (such as the separation distance 14 shown in FIG. 2) to be 1.1 times the critical dimension of the line 32. This distance is preferred for a dark line in a clear field. A distance equal to the critical dimension is preferred for a clear line in a dark field.

SUMMARY OF THE INVENTION

I have discovered that the existing methods described to determine the optimum leveling bar separation and feature size, such as that described U.S. Pat. No. 5,242,770, do not lead to an optimum condition. I have also discovered a method of determining the optimum separation and leveling bar width that is based on the frequency distribution of the masking features. By using this method, the matching of the performance of isolated features and dense features is made possible.

An improvement for determining the placement of sub-resolution imaging assisting bars (referred to as leveling bars in U.S. Pat. No. 5,242,770) to reduce the proximity effects when imaging isolated and dense masking features for integrated circuit microlithography is described. According to the present invention, the placement of additional masking features is determined by considering the diffraction patterns in the lens pupil of the primary feature of interest under conditions where the feature is closely packed with other similar features (referred to as dense geometry) and also where the feature is isolated or nearly isolated, where the next closest feature is separated on the order of more than three times the feature size. The differences between these two diffraction patterns is generally the presence of first diffraction orders for feature sizes near 0.5×Lambda/NA where lambda is the exposing wavelength and NA is the lens numerical aperture. A pair of sub-resolution assisting bars placed on either size of the isolated feature is chosen so that their frequency distribution in the lens is cosinusoidal with the first node of the cosine above a frequency of zero coincides with the frequency of the first diffraction order for the dense features. As this cosine function is added to the diffraction pattern for the isolate feature, the diffraction pattern more closely resembles that of the dense features, reducing proximity effects. The separation distance therefore depends on the pitch of the dense geometry that image performance of the isolated geometry is targeted to. To produce a cosine of appropriate frequency, the center-to-center separation between the main isolated feature of interest and the assisting bar should be equal to the pitch of the desired dense geometry. The critical separation is the center-to-center spacing of the main feature and the assisting bar, not the edge to edge spacing used by others. This is an important aspect of the invention. This center-to-center spacing value is twice the line dimension for 1:1 duty ratio features and greater than that for duty ratios greater than 1:1. The distance is equivalent to the desired pitch distance of the targeted dense features. To match the performance of 1:1.5 features, for instance, the separation is 2.5× the line dimension.

The width of the assisting bars is determined by considering the effect that a pair of non-zero width features has on the resulting cosine diffraction function in the lens pupil. For hypothetical zero-width bars, the cosine exists in the lens pupil unmodulated and the first cosine nodes add to the isolated feature diffraction pattern to produce the addition of equivalent first diffraction order energy. As the assisting bar width increases, the cosine function in the lens pupil is multiplied by the Fourier Transform of a rectangular function representing the bar width. This is a sinc function, which is a maximum at lowest frequencies at the center of the lens pupil and decreases at higher frequencies toward the outside of the lens pupil. The scaling properties of the Fourier Transform are such that larger assisting bars produce more dampening at lower frequencies. The impact is the reduction of the first nodes of the cosine function, reducing the effectiveness of the correction effect and also increasing the likelihood that the assist bars will print. The assist bar width should therefore be as small as possible and as much below the incoherent diffraction limit (0.25×lambda/NA) as possible.

To compensate for the modulation of the cosine function produced in the lens pupil by the pair of non-zero width assisting bars, spatial frequency filtering can be utilized. A filter that resembles the reciprocal of the modulating sinc function is desired. This spatial frequency filter will result in a boosting of the first nodes of the cosine function and result in a closer resemblance between the dense features and the assist bar assisted isolated features.

DRAWINGS

FIG. 1 is mask test pattern utilizing edge intensity leveling bar as shown in U.S. Pat. No. 5,242,770.

FIG. 2 is a mask test pattern showing isolated and densely packed features.

FIG. 3. is a mask pattern of an isolated feature with edge intensity leveling bars spaced in accordance with this invention.

FIG. 4. is a graphical representation of the diffraction pattern of dense features of FIGS. 1 and 2 as a function of spatial frequency FIG. 5 is a graphical representation of the diffraction pattern for the isolated features of FIGS. 1 and 2 as a function of spatial frequency.

Figure 10A:
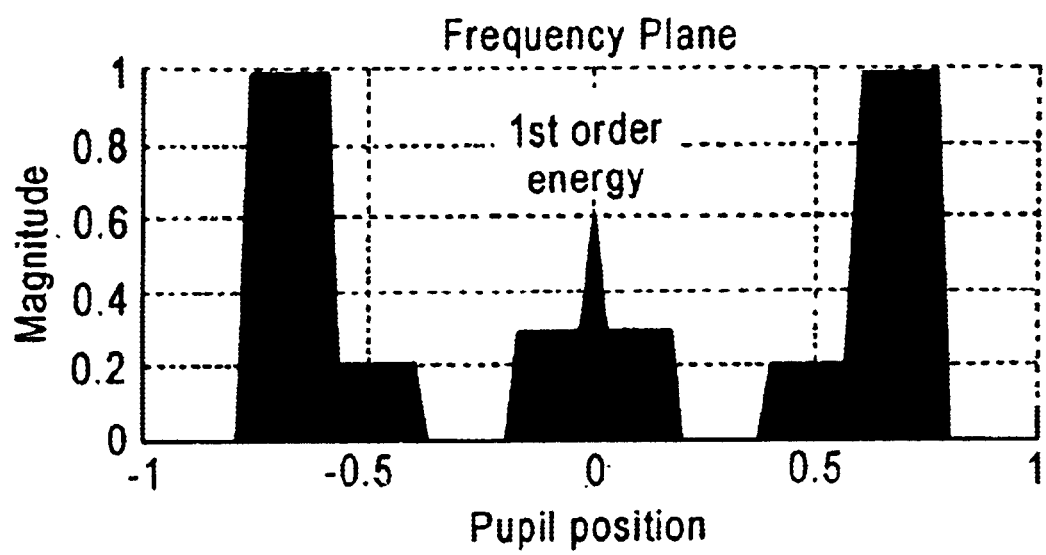
Figure 10B:
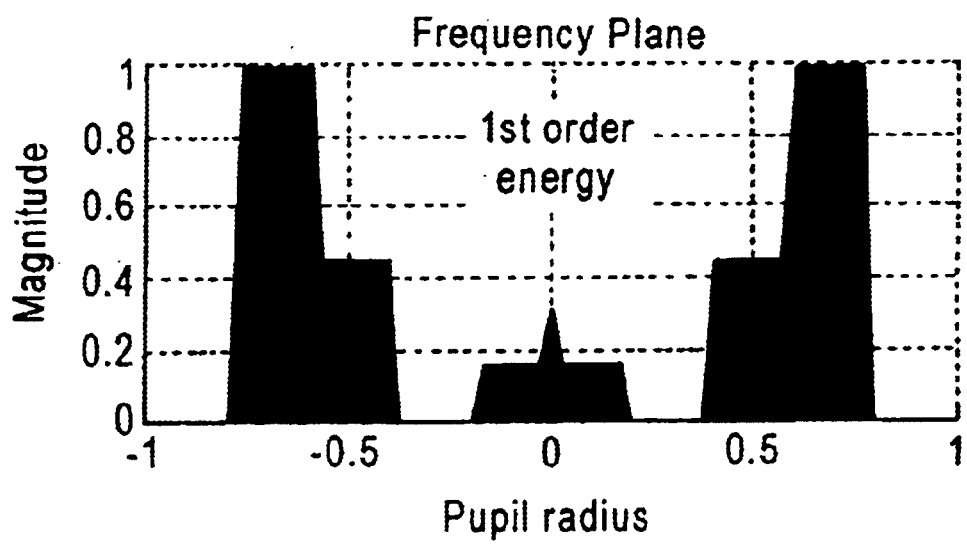
Figure 11B:
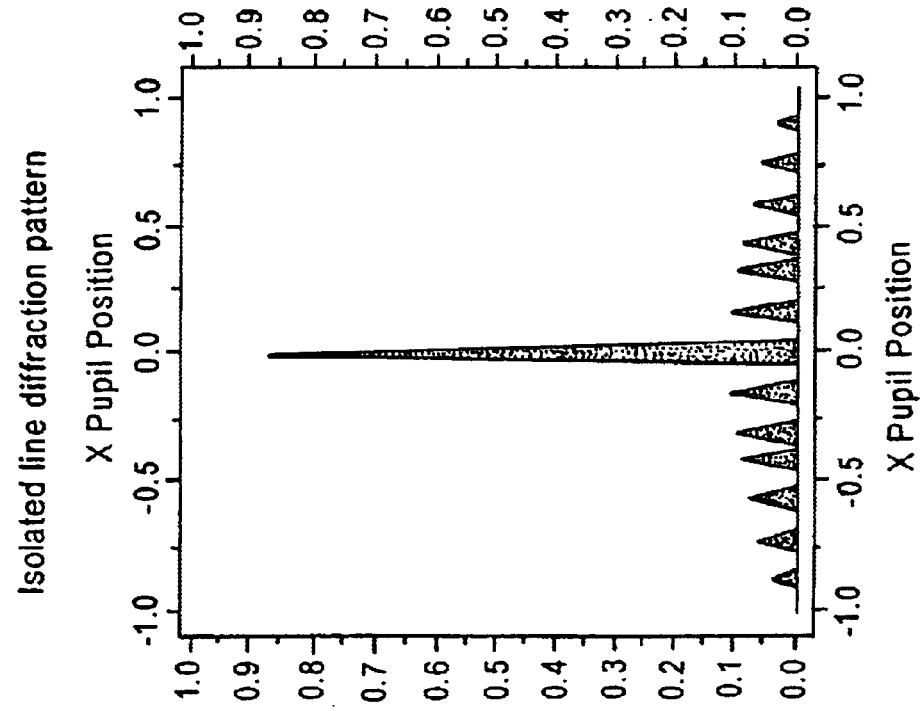
Figure 11A:
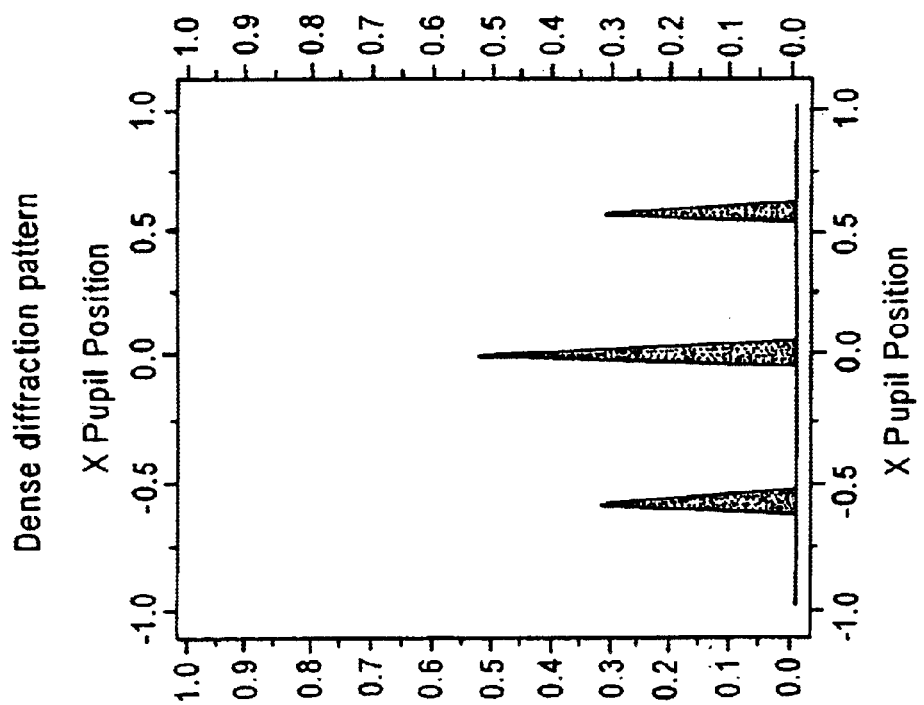
Figure 11D:
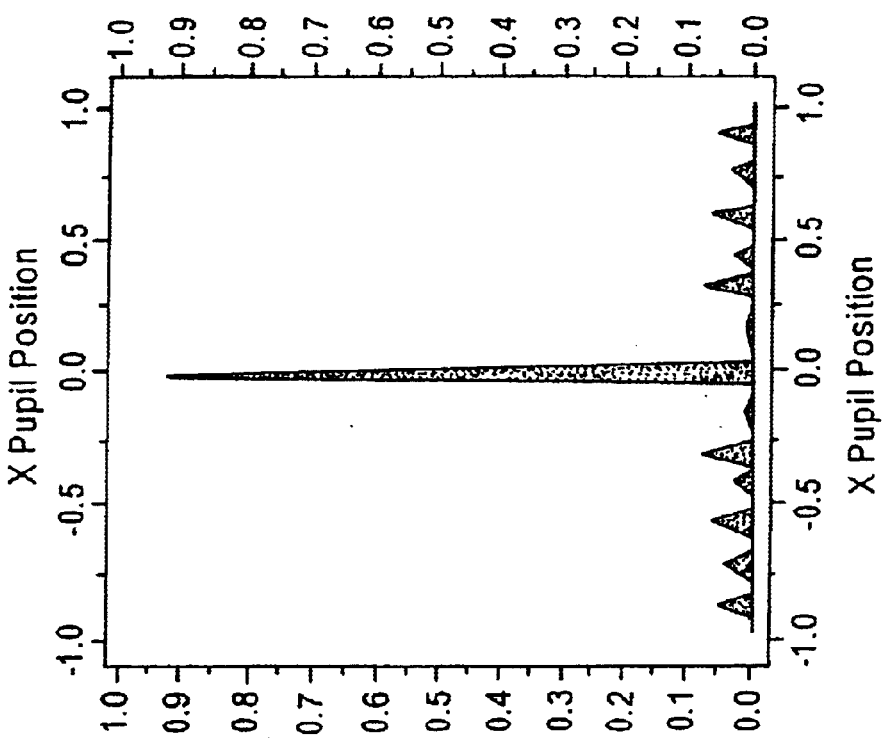
Figure 11C:
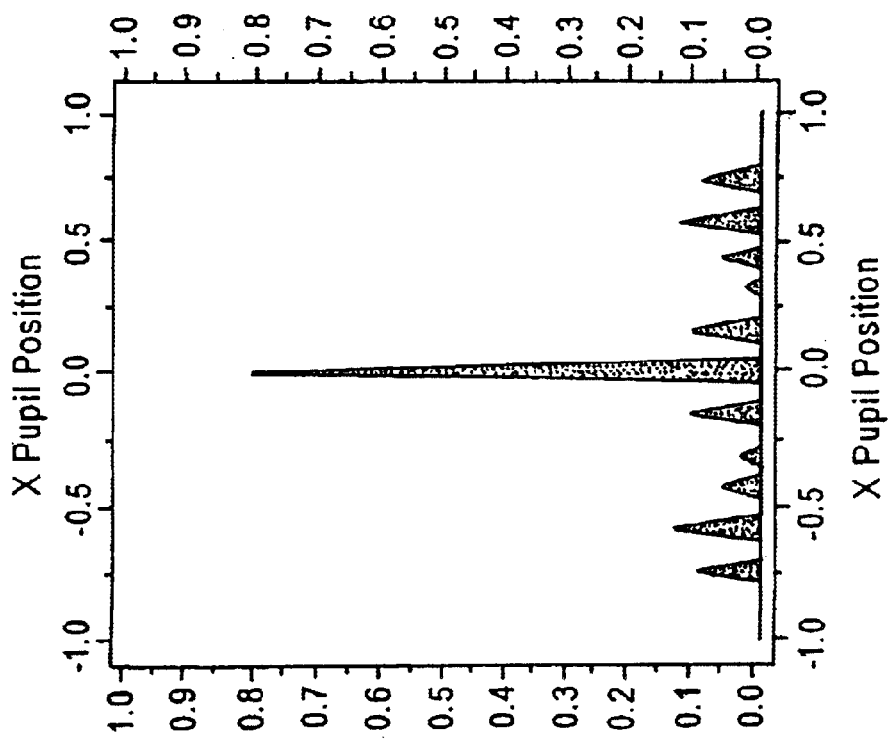

FIGS. 10(a) and 10(b) compare off axis illumination without and with assist bars on isolated features.

FIGS. 11(a)–11(d) are graphical representations of simulated results of diffraction patterns for (a) dense features, (b) an isolated line, (c) an isolated line with one pair of assist bars, and (d) the assist bars themselves.

FIGS. 12(a)–12(d) are graphical representations of simulated results with two assists bar pairs for of diffraction patterns for (a) dense features, (b) an isolated line, (c) an isolated line with one pair of assist bars, and (d) the assist bars themselves.

FIGS. 13(a)–13(d) are graphical representations of diffraction orders for coherent illumination in a lens pupil at duty rations of 1:1, 13(a), 1:3, 13(b); 1:5, 13(c) and 1:7, 13(d).

Figure 14A:
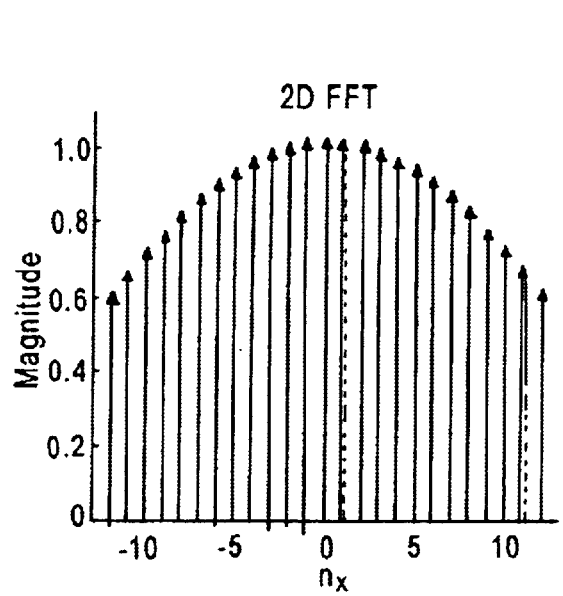
Figure 14B:
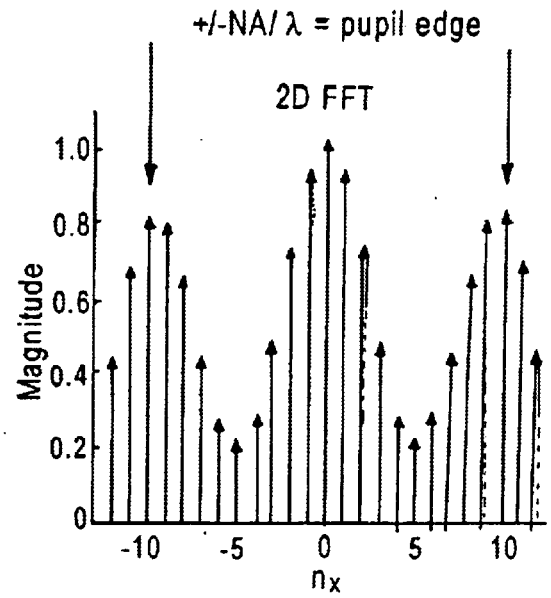

FIGS. 14(a) and 14(b) show the effects of diffraction energy without 14(a) and with 14(b) one pair of assist bars.

Figure 15A:
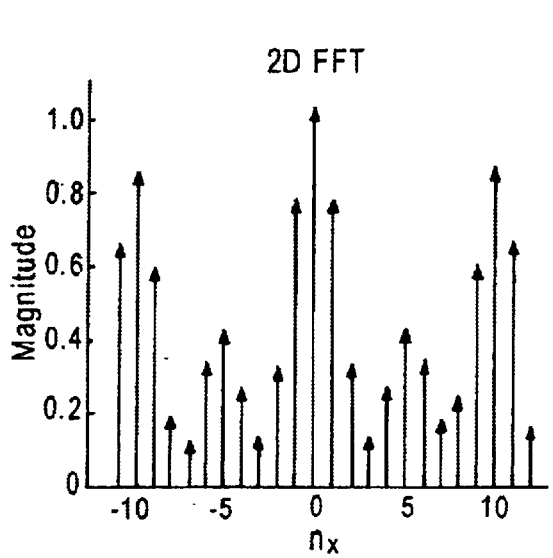
Figure 15B:
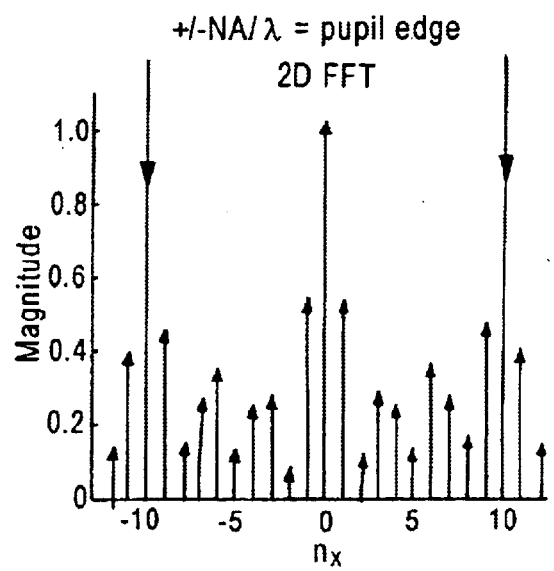

FIG. 15(a) shows the results of redistributing diffraction energy with one pair of bars and FIG. 15(b) shows similar effects with two pairs of bars.

FIGS. 16(a)–16(d) show defocus of isolated features with no assist bars 16(a), with one pair 16(b), with two pair 16(c) and with three pair 16(d); FIG. 16(e) shows the spacing of the assist pairs as s function of wavelength and numerical aperture.

DETAILED DESCRIPTION

Figure 1:
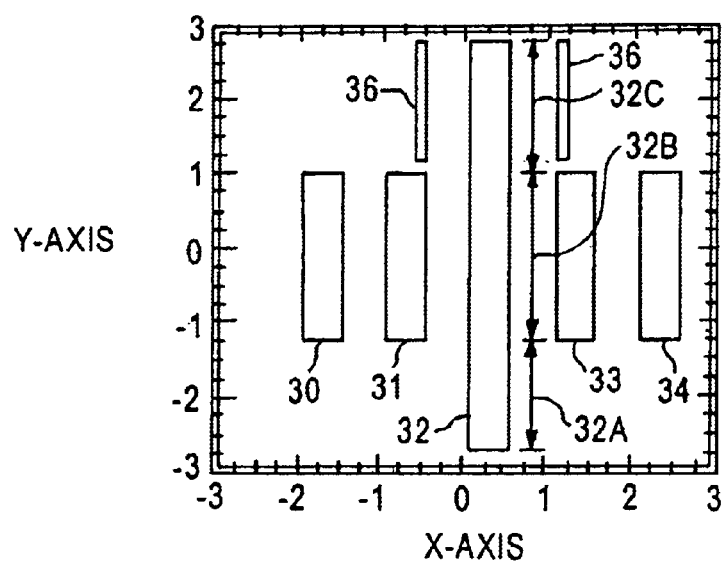
Figure 2:
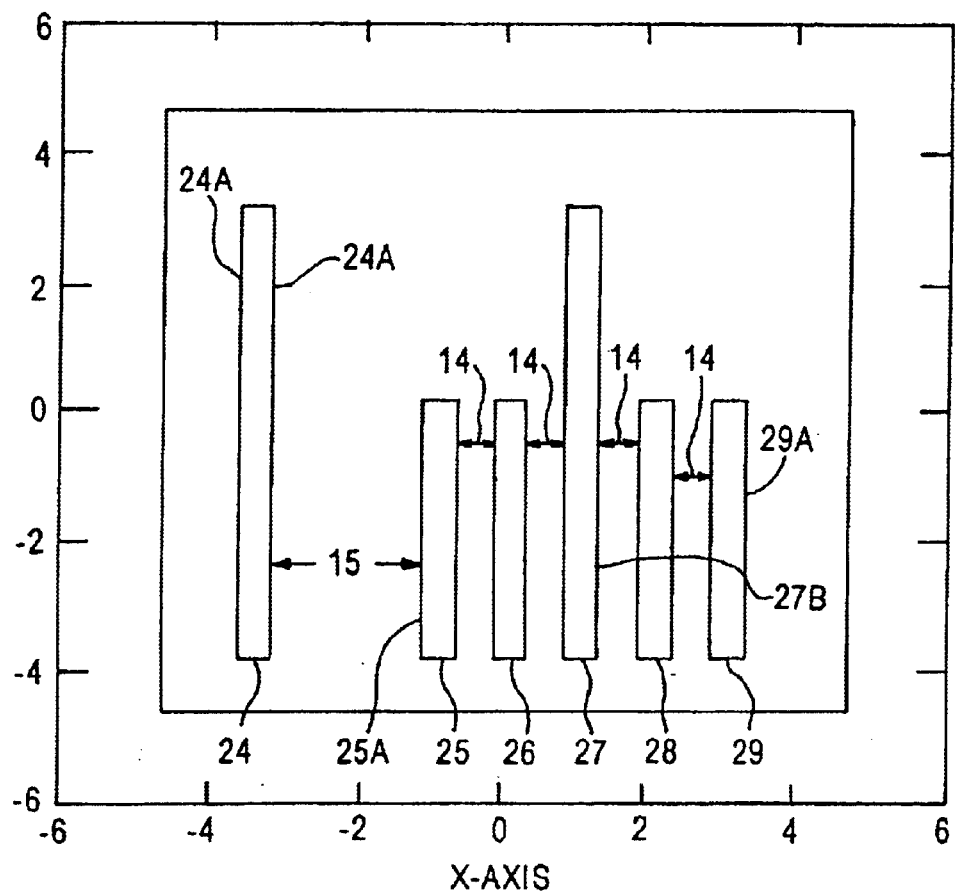
Figure 3:
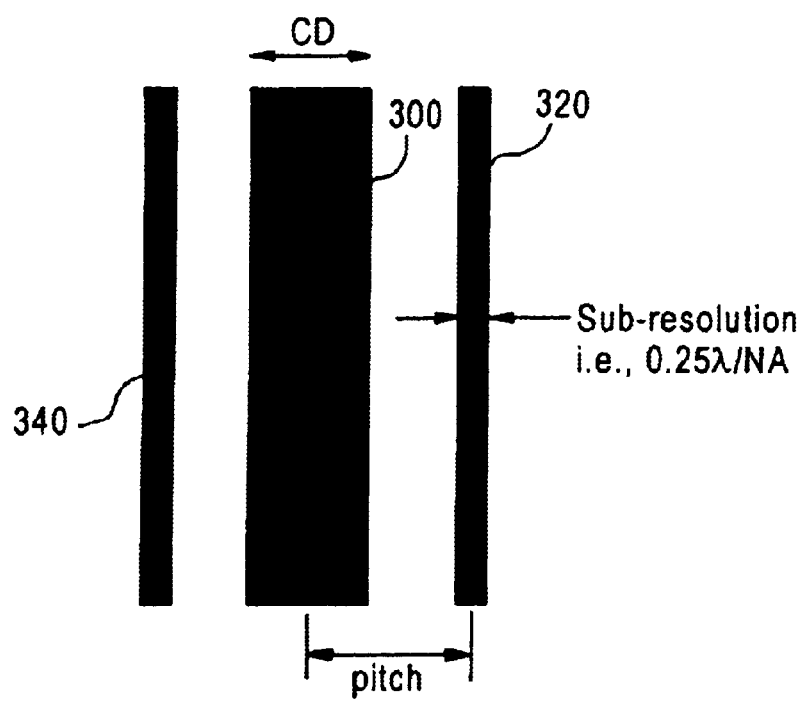

FIG. 3 shows the preferred approach to designing the placement of the assist features on a mask. This example shows dark lines on a clear mask but a similar analysis can be performed for clear lines on a dark mask. The desired separation distance between the assist features 320, 340 and the main feature 300 depends on the duty ratio that performance is targeted to match. For a 1:1 duty, the separation distance is set equal to the pitch. The size of the assist feature does not impact its placement. Placing the assist feature at a multiple of pitch distance will also show some results. As a practical matter the assist bars or features are placed at a separation of desired pitch match. The assist feature is made a small as possible. One may use a pupil filter with sinc (w/p) attenuation in the center vs. edge for inverse gaussian performance. In the preferred embodiment, the pitch from center to center of the isolated feature and the assisting features is the same as the center to center pitch of the dense features.

Figure 4:
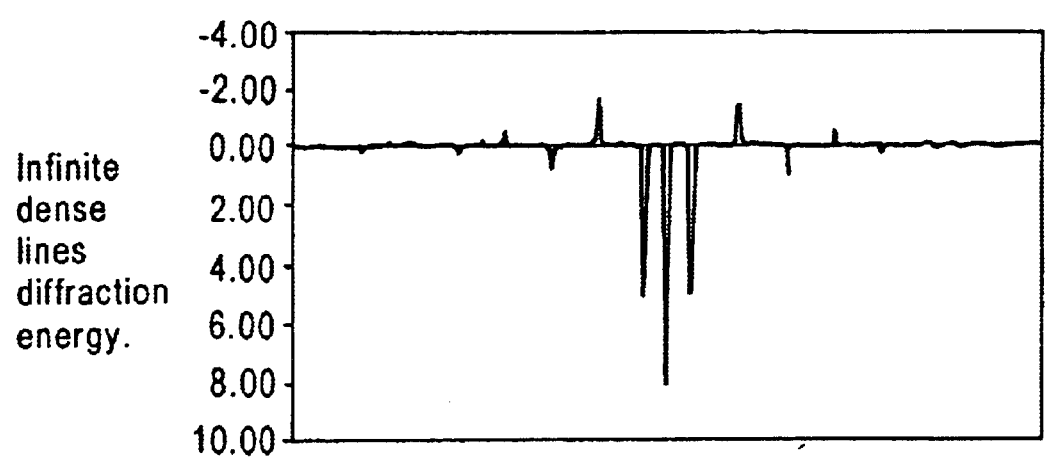
Figure 5:
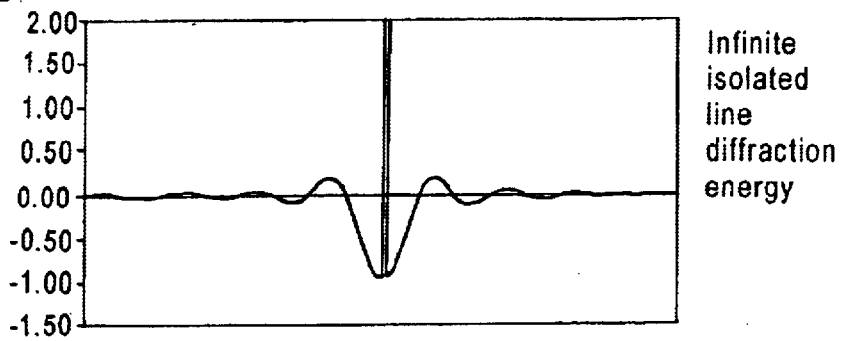
Figure 6:
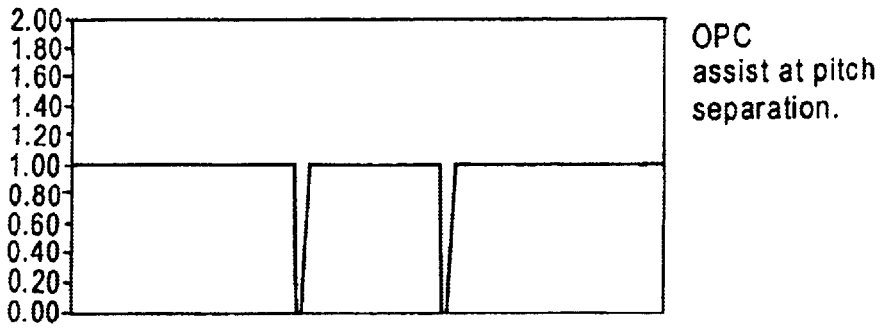
FIG. 6 is a graphical representation showing the intensity of the mask signal of the assisting bars on opposite sides of the isolated feature of FIG. 3.
Figure 7:
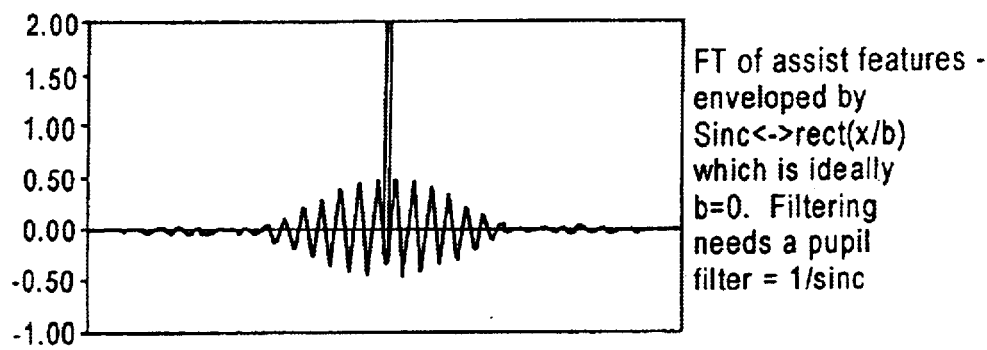
FIG. 7 is a graphical representation of the diffraction pattern for the assisting bars of FIG. 3 as a function of spatial frequency.
Figure 8:
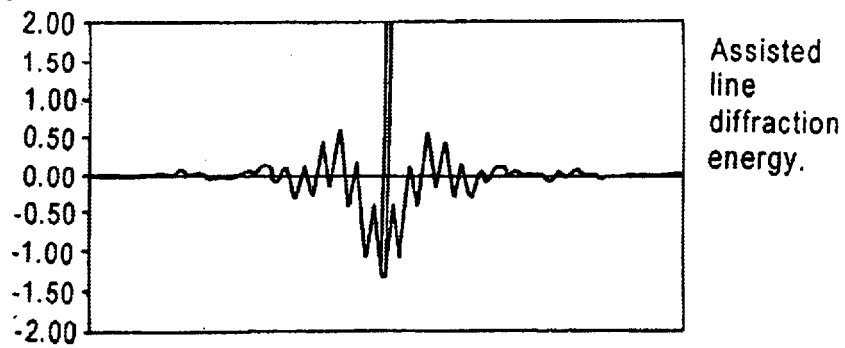
FIG. 8 is a graphical representation of the diffraction energy distribution for the isolated feature and its assisting bars of FIG. 3 as a function of spatial frequency.

FIG. 4 shows the diffraction pattern vs. spatial frequency for dense features and FIG. 5 shows the diffraction pattern vs. spatial frequency for an isolated feature. FIG. 6 shows assist bars placed on opposite sides of the isolated feature, as shown in FIG. 3. The diffraction pattern for the assist features alone is shown in FIG. 7. The frequency of the cosine function should be $\cos(2\pi pu)$ where p is the pitch of the dense features targeted to match and u is the one dimensional frequency coordinate in the lens pupil. As seen from FIG. 7, the cosine function is modulated by a sinc function, a result of the non-zero width of the assist bars. The frequency of the cosine is chosen so that the first nodes coincide with the first diffraction order of the dense features. This occurs when the assist bars are spaced at a center-center distance of the pitch distance of the desired dense lines. The resulting diffraction energy distribution is shown in FIG. 8. The pattern of assisted isolated feature of FIG. 8 is closer to the dense pattern of FIG. 4 than is the pattern of the isolated feature of FIG. 5. For small features (close to 0.5×lambda/ NA), only a small portion of this diffraction energy falls within the lens. More specifically, energy near and below the frequency of the first diffraction order for the dense lines (and near and below the first node of the assisting bars diffraction energy cosine) is collected.

Figure 9:
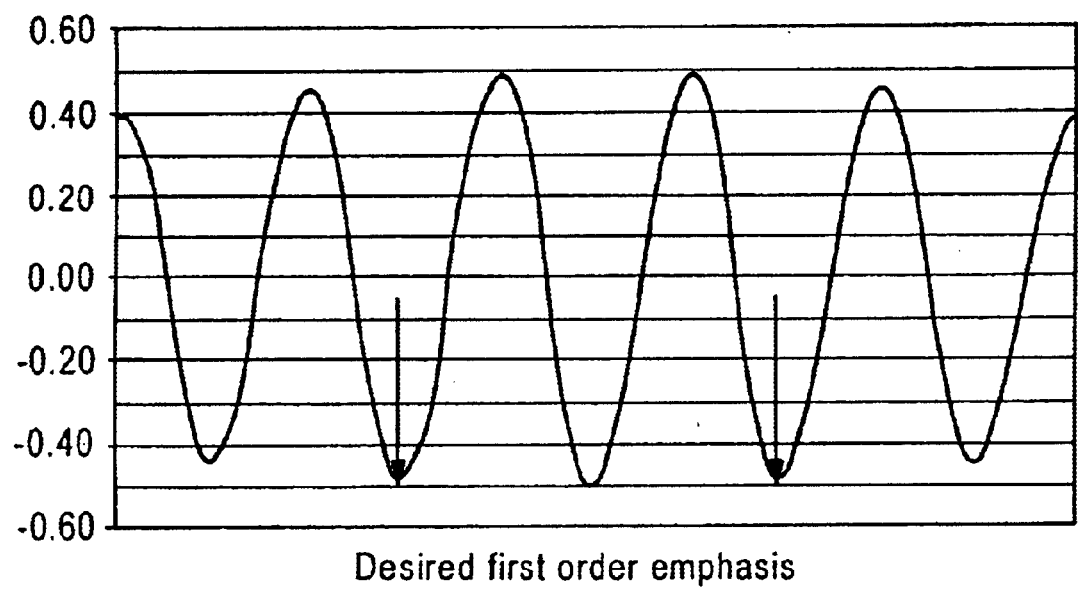
FIG. 9 is a graphical representation of the damping due to the assisting bar cosine diffraction energy.

An enveloping sinc function modulates the assisting bar cosine diffraction energy and causes a dampening effect to the first cosine nodes. FIG. 9 shows this effect. The loss in energy at the first nodal or diffraction order frequency is exactly $\text{sinc}(w/p) = [\sin(\pi w/p)]/[\pi w/p]$ for a assisting bar width of w and a separation distance (equal to the dense pitch) of p.

As an example consider FIG. 8 where a 260 nm dense pitch mask feature (130 nm 1:1) and target isolated proximity effect correction using assisting bars. An assisting bar width of and 80 nm is chosen, which may represent the current limitations to mask making. The modulation of the first cosine nodes (equivalent to the first diffraction order) is calculated as $\text{sinc}(w/p) = 0.85$ or 85% attenuation as compared to the central pupil amplitude as can be seen in FIG. 8. Smaller assist features would result in less attenuation but these become challenging to fabricate. Therefore, use of pupil filtering of at least 85% attenuation of the center of the pupil as compared to the first diffraction order position is desirable for these assist features. This can be accomplished using spatial frequency filtering in the pupil or in other equivalent pupil positions or Fourier Transform planes in optical system. The filter is designed with a transmission vs. frequency distribution designed to resemble $1/[\text{sinc}(w/p)]$ over the range of the lens NA (which has a frequency of NA/lambda).

FIG. 11 shows simulated results using a commercial lithography simulator (Prolith/2 version 6.05d) for 150 nm geometry using 193 nm. The diffraction pattern is an isolated feature at nearly 1:8 spacing is shown in FIG. 11b; the diffraction pattern for dense features of about 1:1 is shown in FIG. 11a. The diffraction pattern for assisting bars with a 75 nm width and a center-to-center separation of 300 nm is shown in FIG. 11(d). The diffraction pattern for the assisted 150 nm features of FIG. 11(c) more closely resembles that of the dense features of FIG. 11(a) than does the pattern of the isolated feature without assisting bars, FIG. 11(b).

It is further possible to improve matching the diffraction energies between isolated and dense features by adding a second pair of assisting features, centered and each separated by a distance-to-center of twice the desired pitch from the center feature of interest. This has the impact of adding additional cosine nodes at a frequency position corresponding to the desired first diffraction order and also at a frequency position of half of the desired first order, equivalent to 0.5/p. This results in boosting energy at the first diffraction order frequency and reducing the amplitude of the zero order. FIG. 12 shows the results for 150 nm geometry and two pairs of 50 nm assisting bars. These bars are spaced at 300 and 600 nm from the center of the main feature to the center of the assisting bar. Again, the pattern of the isolated feature with assisting bars as shown in FIG.

Figure 12B:
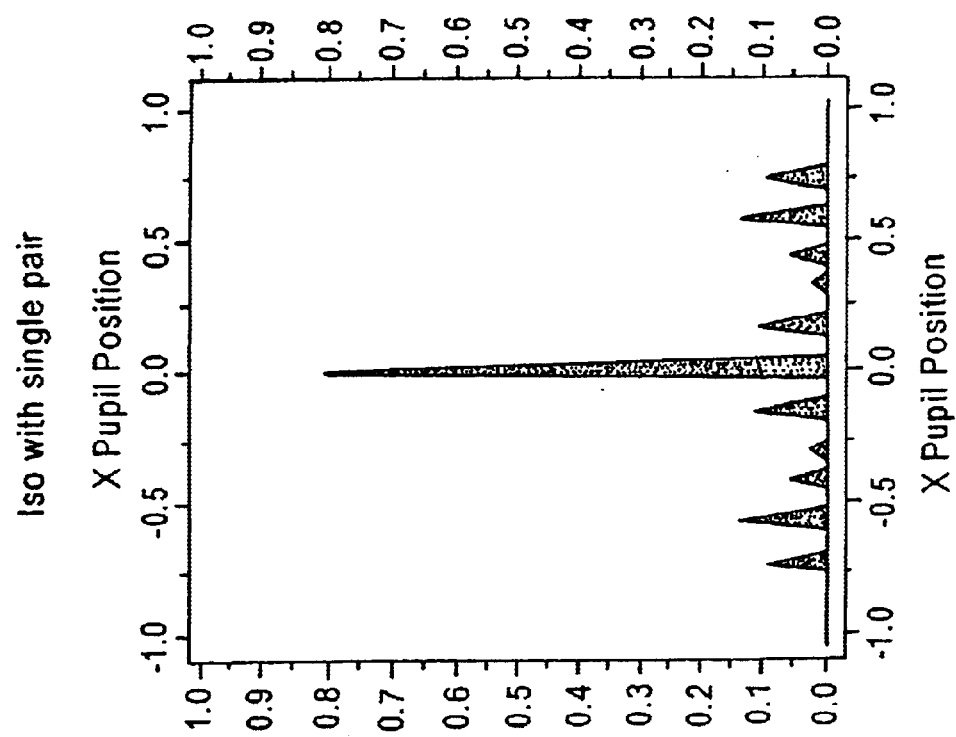
Figure 12A:
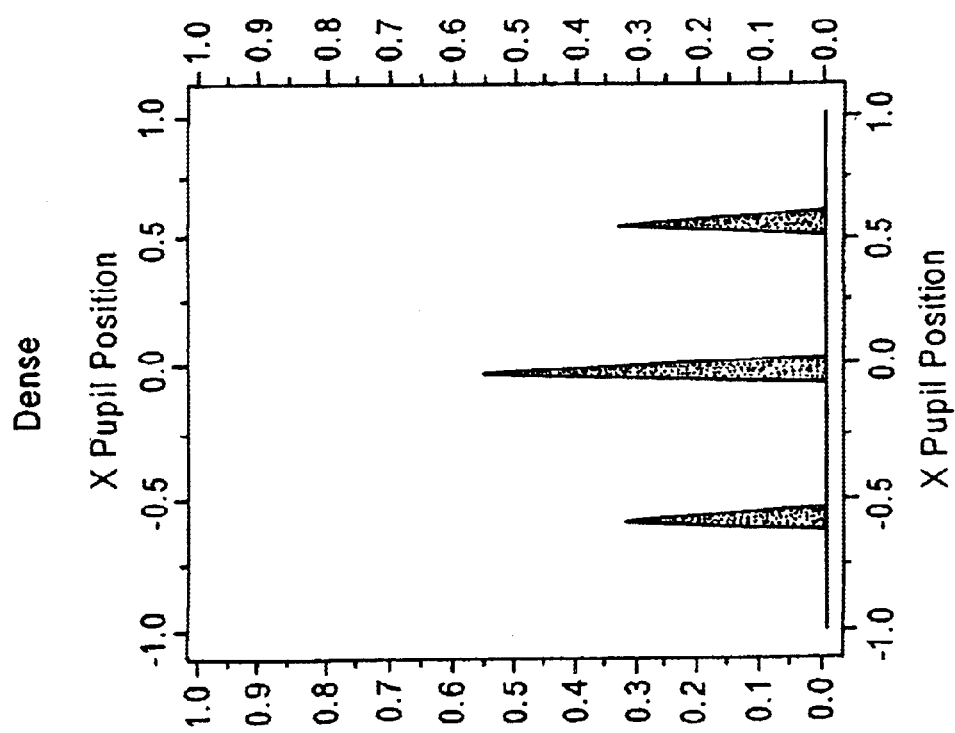
Figure 12D:
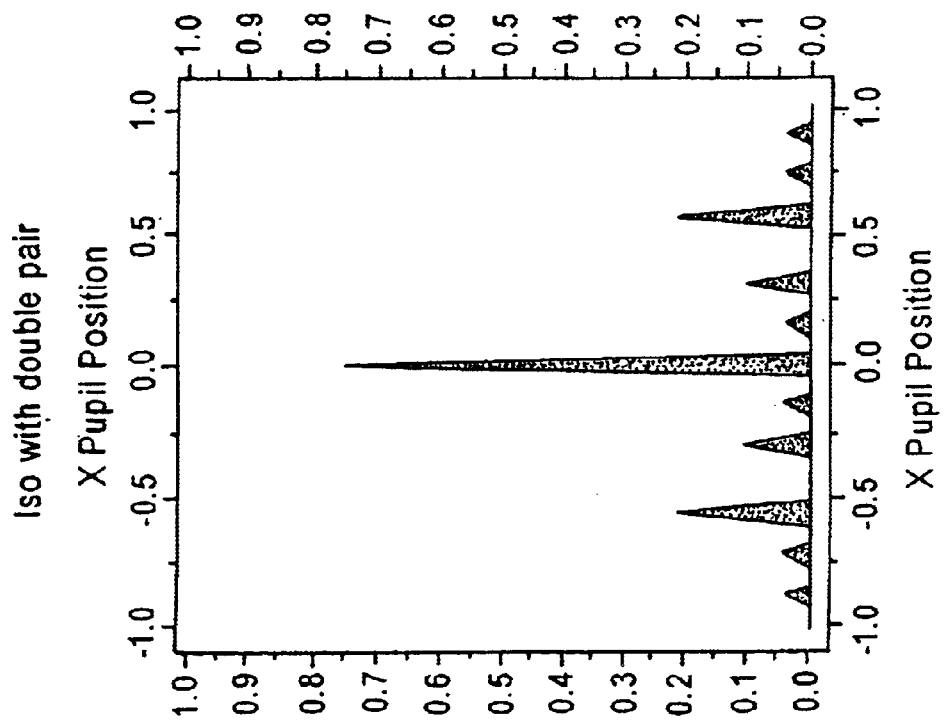
Figure 12C:
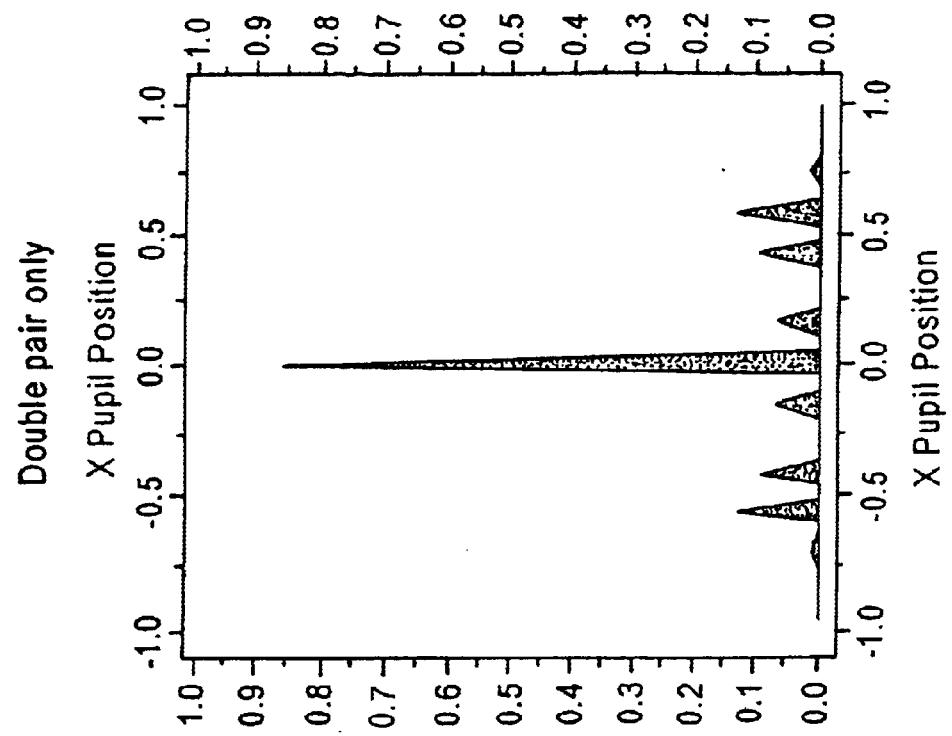
Figure 13B:
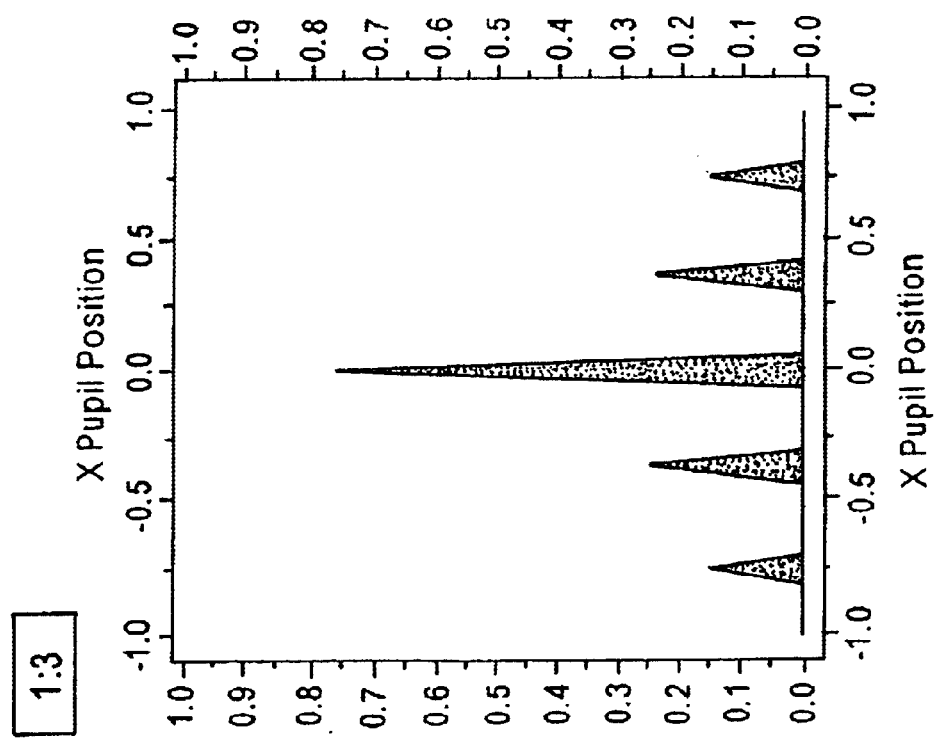
Figure 13A:
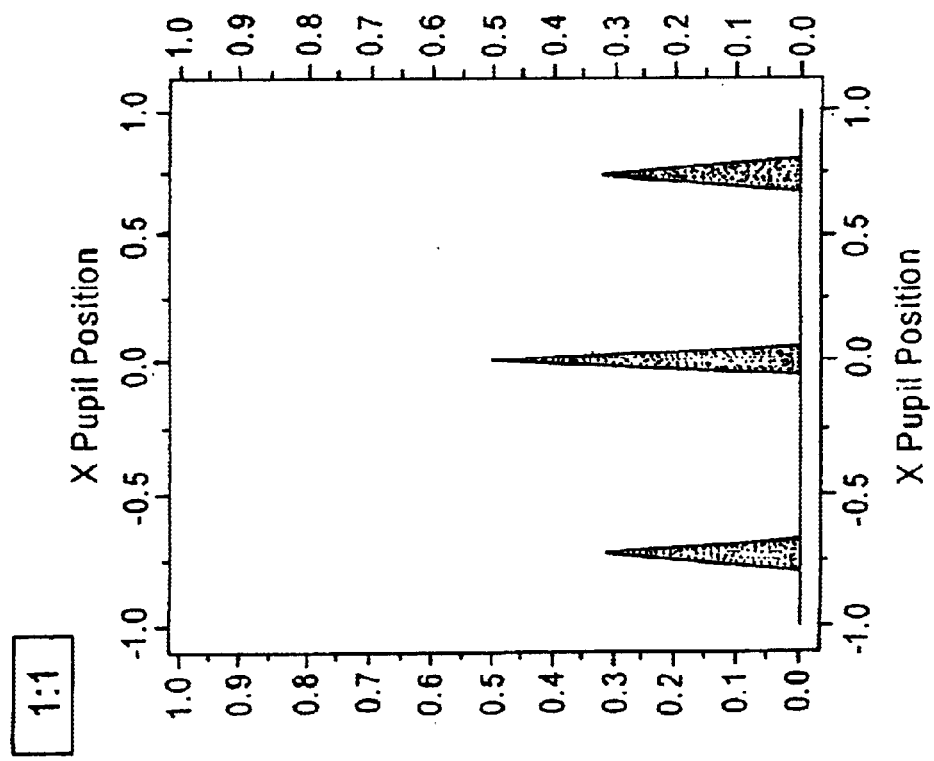
Figure 13C:
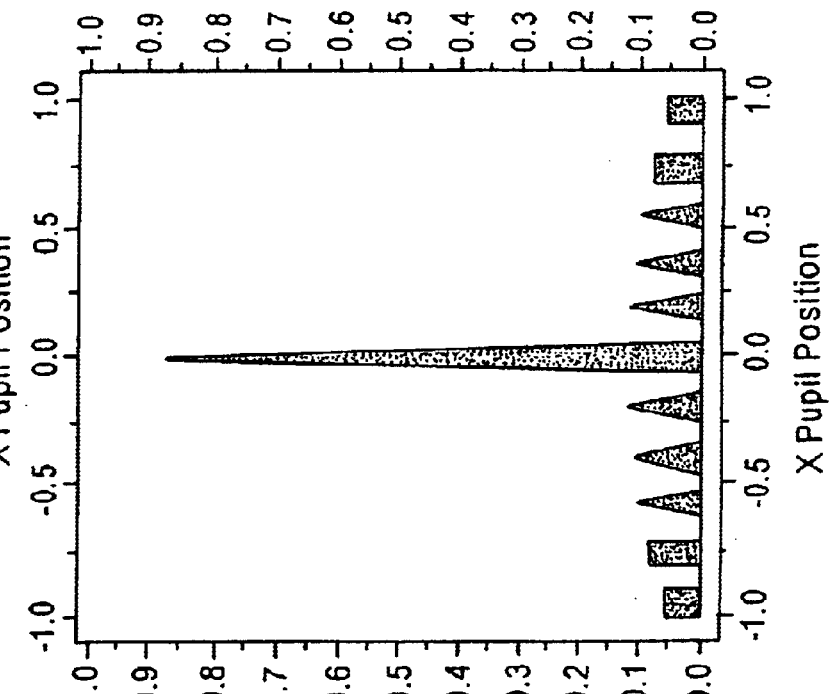
Figure 13D:
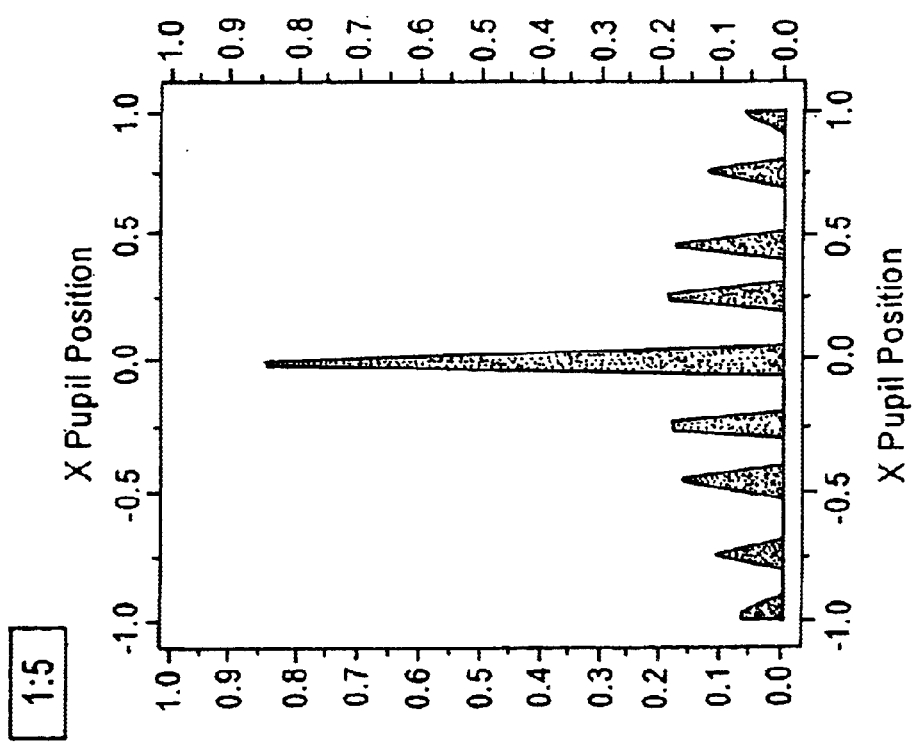

12(c) more closely resembles the diffraction pattern of the dense features in FIG. 12(a) than does either the isolated feature with a single pair of bars, FIG. 12(b) or the pattern of the double bars, FIG. 12(d).

Preferred Duty Ratio

Imaging performance is more closely matched to dense features by adding assisting bars with predetermined separation and sizing parameters in proximity to isolated features. Optimum separation and sizing parameters of the bars are described in this invention where cosinusoidal functions are controlled within then lens pupil. Since features are realistically never completely isolated (there is always some neighboring geometry if a large enough window is considered), this can be taken into account when designing mask feature and assisting feature layout.

Let us consider semi-isolated features compared to densely packed features. FIGS. 13(a)–13(d) show a situation where 130 nm lines are being imaged at a 193 nm exposure wavelength. The figure shows the diffraction orders for coherent illumination in a lens pupil with an effective numerical aperture of unity. Duty ratio values of 1:1, 1:3, 1:5, and 1:7 are shown where the $2^{nd}$ diffraction order of the 1:3 duty ratio features coincide with the $1^{st}$ diffraction order for the 1:1 duty ratio. For 1:5 duty ratio features, the $3^{rd}$ order coincides with the 1:1 $1^{st}$ order and for the 1:7 duty ratio features, the $4^{th}$ order coincides. This is an important situation because an assisting feature cosinusoidal frequency functions exist within the lens pupil and their impact is greatest if maximum diffraction energy can be placed at the first diffraction order position for features of targeted pitch. In all of these cases, there is diffraction order energy at these required frequency positions. Because of the features are not completely isolated, assisting features added to the more isolated geometry (defined as 1:3 and greater) also have a repeating nature. The cosine functions in the pupil that result from this periodicity are also sampled at these same frequency, which can be represented as

[Cos(2πpu)×comb(up')]×sinc(w/p).

Where the comb function is a series of Dirac delta functions (or impulse functions), u is the frequency value in the pupil, p' is the pitch of the isolated feature. If p' is a multiple of p (the pitch of the desired matching dense features), there will be a coincidence of diffraction orders, as described in the example above and in FIG. 13. This is an important aspect of the invention. During design of mask features, the performance of assisting bars can be improved when a semi-isolated feature (not completely isolated but with distant neighboring geometry) has a pitch value which is a multiple of the pitch value of the targeted feature. For 1:1 dense targeted features, this becomes the pitch equivalent to 1:3, 1:5, 1:7 and so forth for the more isolated features. If the pitch of the semi-isolated features was 1:2 or 1:4 the pitch of the dense features, there would be little or no increase in proximity correction. For 1:1.2 dense targeted features, this becomes 1:3.4, 1:5.6 and so forth. For 1:1.5 dense targeted features, this becomes 1:4, 1:6.5 and so forth. Designing mask geometry to contain these feature duty ratio or pitch values will enhance the performance improvement achieved when using assisting feature proximity correction methods.

The effects of partial coherence can lead to further improvement. By increasing the size of the effective source though larger partial coherence values, diffraction energy of the dense and assisted isolated features is brought closer together. This does not impact the choice of assisting feature position (separation) or size.

Globally Isolated Features

I have discovered that when features are very isolated (generally greater than 1:7 for lines or 7:1 for spaces), the method for placement of assist features can be modified somewhat. The goal is to reduce the sensitivity of isolated geometry (lines or spaces) to aberration effects, which includes defocus. In a perfect lens system, maximum depth of focus is the greatest concern since no lens aberration would exist. In the presence of aberrations, both maximum depth of focus and minimum impact of aberrations is desired. I have shown in previous papers (Smith, SPIE Optical Microlithography XI and XII 1998 and 1999) that the impact of aberrations is dependant on the position of diffraction energy within the pupil. By using assisting features, diffraction energy of a feature can be redistributed to lie within the most advantageous portions of the pupil. To maximize depth of focus (and minimize the impact of defocus), it is desirable to have maximum diffraction energy at the edge of the pupil with as little energy in the center of the pupil as possible (image degradation is caused by phase error of diffraction orders across the pupil). The same situation exists for spherical and other symmetrical aberrations. For astigmatism, the situation is such that distribution of energy toward the edge of the pupil may lead to an increase in image degradation across horizontal and vertical directions. Coma effects can be minimized when balanced with tilt as energy is distributed toward the edge of the pupil.

Isolated features experience more aberration that dense features. If assisting optical proximity correction bar pairs are placed on sides of an isolated feature, the cosine "node" described earlier place diffraction energy at higher frequency positions in the pupil. If there is no goal of matching a desired pitch (of more dense features) then the goal should be to improve performance of the isolated features in the presence of aberration and defocus. Aberration levels of today's lenses approached 0.03 waves RMS (OPD). The amount of defocus introduced when imaging over topography in a photoresist materials in much greater than this, on the order of 0.25 waves. In this case, it is best to optimize the placement of assisting bars so that the defocus aberration is minimized. In the presence of other aberrations, any defocus-aberration interactions may require design so that energy is placed at other similar locations but for the most part, the defocus condition will over-ride. (The above references describe optimum pupil positions for minimizing aberration).

In order to place diffraction energy at the edge of the pupil, the frequency of the pupil edge must be known. For a given numerical aperture (NA) and wavelength (λ), this frequency is NA/λ. The assisting bars should be placed at multiples of this NA/λ frequency. By placing a pair of bars with each spaced at a distance λ/NA from the main feature (center to center), the fundamental frequency of the primary cosine and harmonics of higher frequency cosines adds diffraction energy at the optimum pupil edge position. One pair of bars at a separation of λ/NA can be used. Two pairs of bars at the first separation distance and at 2λ/NA can be used for improvement. Three pairs improve further by adding an additional pair at 3λ/NA. Four or more pairs also improves. The limit is the point where minimal additional improvement is realized or mask geometry inhibits additional pairs.

FIG. 14(a) shows an application for 248 nm, 0.52NA and 180 nm 21:1 spaces (very isolated). By adding assist space features 60 nm wide at a separation of 400 nm, the diffraction energy in the pupil is moved toward the edge and away from the center. See FIG. 14(b). FIGS. 15(a) and 15(b) show other examples where 2 and 3 pairs of bars provide further improvements.

Figure 16B:
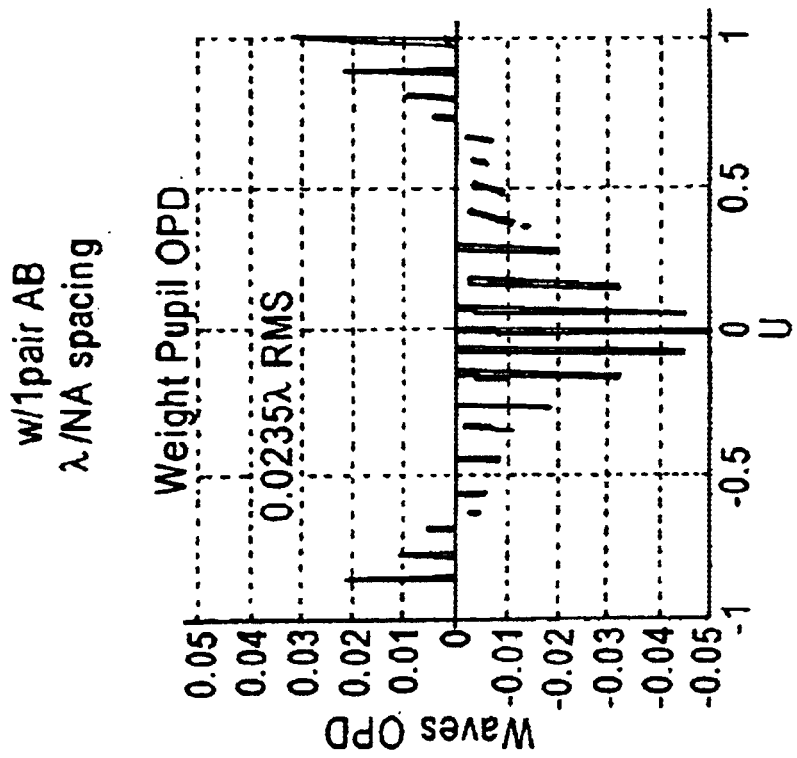
Figure 16A:
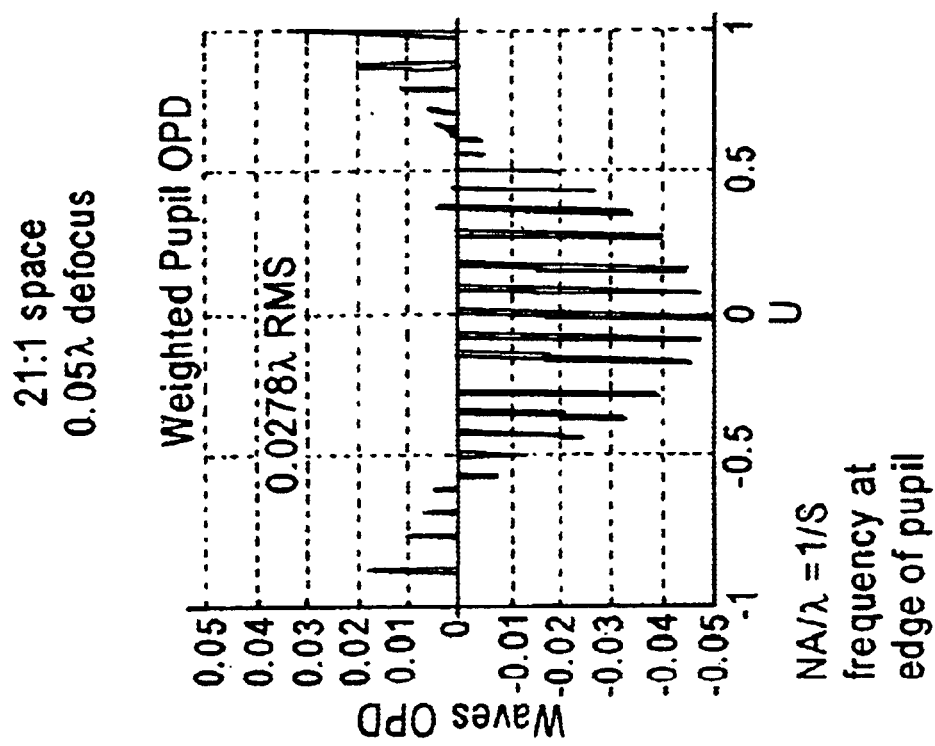
Figure 16C:
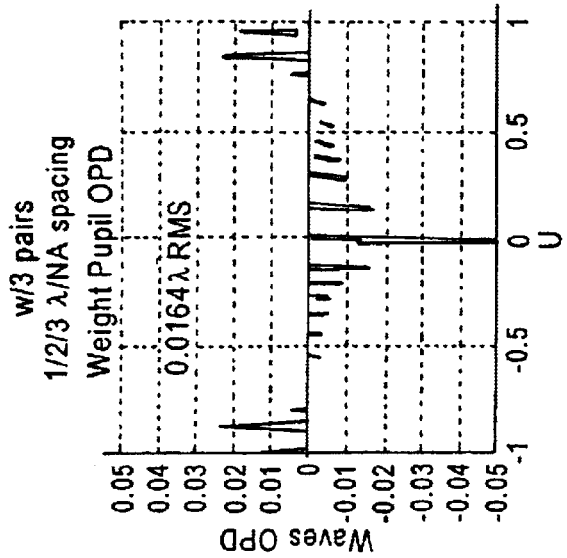
Figure 16D:
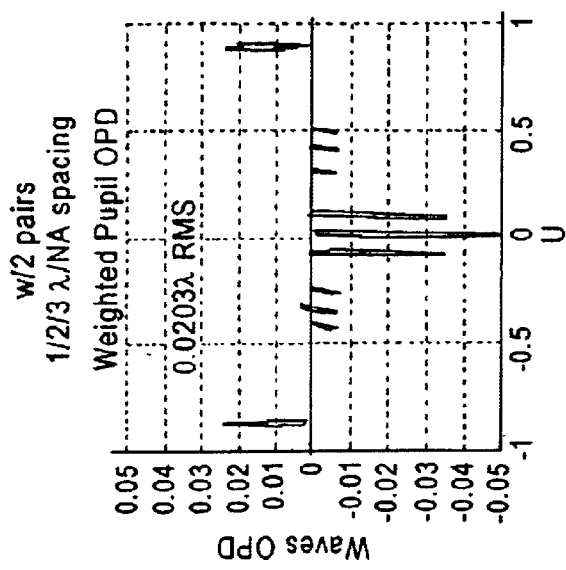
Figure 16E:
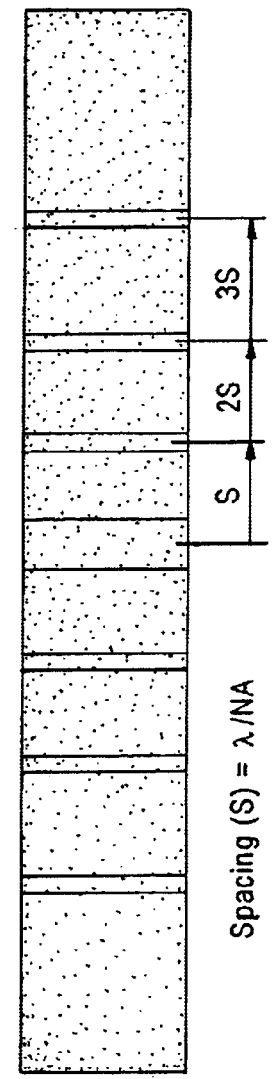

FIGS. 16(a)–(e) show how the invention will improve performance with defocus aberration. FIG. 16(e) shows a mask pattern with three pairs of assist bars. A defocus value of 0.05 waves was introduced to compare an unassisted bar with 1, 2 and three pairs of bars. The RMS OPD for the isolated spaces is 0.0278 waves. With 1 pair of assist features, FIG. 16(b) shows the value decreases to 0.0235 waves. With 2 pairs the value decreases to 0.0203 waves. See FIG. 16(c). With 3 pairs, as seen in FIG. 16(d), the value decreases to 0.0164 waves. This dramatic improvement will lead to a decrease in the impact of defocus to imaging a 180 nm space. Assist features of 60 nm in width do not print in a suitably optimizing thresholding resist process. The depth of focus can therefore be improved.

Off-Axis Illumination

I have also discovered that OPC methods can be optimized for particular conditions of customized or off-axis illumination. The control of the relative size of the illumination system numerical aperture has historically been used to optimize the performance of a lithographic projection tool. Control of this NA with respect to the projection systems objective lens NA allows for modification of spatial coherence at the mask plane, commonly referred to as partial coherence. This is accomplished through specification of the condenser lens pupil size with respect to the projection lens pupil in a Köhler illumination system. Essentially, this allows for manipulation of the optical processing of diffraction information. Optimization of the partial coherence of a projection imaging system is conventionally accomplished using full circular illuminator apertures. By controlling the distribution of diffraction information in the objective lens with the illuminator pupil size, maximum image modulation can be obtained. Illumination systems can be further refined by considering variations to full circular illumination apertures. A system where illumination is obliquely incident on the mask at an angle so that the zeroth and first diffraction orders are distributed on alternative sides of the optical axis may allow for improvements. Such an approach is generally referred to as off-axis illumination. The resulting two diffraction orders can be sufficient for imaging. The minimum pitch resolution possible for this oblique condition of partially coherent illumination is $0.5\lambda/NA$, one half that possible for conventional illumination. This is accomplished by limiting illumination to two narrow beams, distributed at selected angles. The illumination angle is chosen uniquely for a given wavelength ($\lambda$), numerical aperture (NA), and feature pitch (d) and can be calculated for dense features as $\sin^{-1}(0.5\lambda/d)$ for $NA=0.5\lambda/d$. The most significant impact of off axis illumination is realized when considering focal depth. In this case, the zeroth and 1st diffraction orders travel an identical path length regardless of the defocus amount. The consequence is a depth of focus that is effectively infinite.

In practice, limiting illumination to allow for one narrow beam or pair of beams leads to zero intensity. Also, imaging is limited to features oriented along one direction in an x-y plane. To overcome this, an annular or ring aperture has been employed that delivers illumination at angles needed with a finite ring width to allow for some finite intensity. The resulting focal depth is less than that for the ideal case, but improvement over a full circular aperture can be achieved. For most integrated circuit application, features are limited to horizontal and vertical orientation, and a quadrupole configuration may be more suitable. Here, poles are at diagonal positions oriented 45 degrees to horizontal and vertical mask features. Each beam is off-axis to all mask features, and minimal image degradation exists. Either the annular or the quadrupole off-axis system can be optimized for a specific feature size, which would provide non-optimal illumination for all others. For features other than those that are targeted and optimized for, higher frequency components do not overlap, and additional spatial frequency artifacts are introduced. This can lead to a possible degradation of imaging performance.

When considering dense features (1:1 to 1:3 line to space duty ratio), modulation and focal depth improvement can be realized through proper choice of illumination configuration and angle. For isolated features, however, discrete diffraction orders do not exist; instead a continuous diffraction pattern is produced. Convolving such a frequency representation with either illumination poles or annular rings will result in diffraction information distributed over a range of angles. Isolated line performance is, therefore, not improved with off-axis illumination. When features are not isolated but have low density (>1:3 line to space duty ratio), the condition for optimum illumination will not be optimal for more dense features. Furthermore, the use of off-axis illumination is generally not required for the large pitch values that have a low-density geometry. As dense and mostly isolated features are considered together in a field, it follows that the impact of off-axis illumination on these features will differ, and a large disparity in dense to isolated feature performance can result.

Optical proximity correction (OPC) using assist features can lead to improvement with off-axis illumination (OAI). By designing assist features around the "preferred duty ratio" described earlier, and by designing off-axis illumination around this same duty ratio (see for instance my patent application "Illumination Device for Projection System and Method for Fabricating, U.S. patent application Ser. No. 09/422,398, whose disclosure is herein incorporated by reference), OPC and OAI can work together to reduce the process complexity of either approach alone or make possible imaging resolution and DOF that could not be easily achieved otherwise. The concept is similar to that described earlier. By adding assisting bars with predetermined separation and sizing, higher diffraction orders can be positioned to overlap lower diffraction orders in the objective lens pupil. Designing around "mask feature harmonics" with both illumination and OPC allows for more manufacturable solutions for sub-half wavelength feature resolution.

FIG. 10(a) shows the results of off axis illumination on a pattern with isolated features and no assist bars. Compare it to FIG. 10(b) where assist bars are added. Off axis illumination has been used to illuminate 150 nm lines with a line spacing of 450 nm, using a wavelength of 248 nm, a numerical aperture of 0.70, and dipole off axis illumination. The dipole illumination consists of two poles oriented on an axis orthogonal to the axis of the 150 nm long lines on the photomask. The illumination angle of each pole in the illuminator is $\sin^{-1}((lambda)/(2*p))$ where p is a value of 300 nm, the pitch of equal line/space 150 nm features. FIG. 10(a) shows the distribution of diffraction orders in the objective lens pupil for the illumination of 150 nm lines with a 450 nm pitch under these conditions. The energy in the center of the pupil is 30% of the intensity of the diffraction orders at the edge of the pupil. This will result in image degradation as the image plane is varied through focus. By using assisting bars, FIG. 10(b) shows that the energy at the center of the pupil is reduced when using dipole off axis illumination. This decreases the image degradation as the image plane is varied through focus. The effect is shown for dipole illumination. Other off-axis illumination will give similar results.

What is claimed is:

1. In a photomask for optically transferring a lithographic pattern corresponding to an integrated circuit (IC) from said photomask onto a substrate, said pattern including a plurality of densely spaced features and an isolated feature spaced from the densely spaced features, said isolated feature having at least one pair of assist bars on opposite sides of said isolated feature and spaced equally from the corresponding side of the isolated feature opposite the assist bar, wherein the assist bars alter the edge intensity gradient of edges of the isolated feature to reduce proximity effects, the improvement comprising:

spacing the assist bars such that the distance from the center of each assist bar to the center of an adjacent isolated feature is substantially equal to the pitch of the densely spaced features.

2. The photomask of claim 1 wherein the assist bars are spaced so that a first node of their diffraction cosine falls at the first diffraction order position of the densely spaced features.

3. The photomask of claim 1 wherein the isolated feature is spaced from the densely spaced feature by at least 7 times the pitch of the densely spaced features and the assist bars are spaced at equal multiples of a distance of lambda/NA from the center of the isolated feature, where lambda is the illumination wavelength and NA is the numerical aperture.

4. The photomask of claim 1 wherein the assist bars are spaced from the isolated feature a distance for generating a diffraction pattern having a cosine function with nodes that coincide with the first diffraction order of the densely spaced features.

5. The photomask of claim 1 wherein the width of each assist bar is as small as possible.

6. The photomask of claim 1 wherein the width of each assist bar is less than the incoherent diffraction limit.

7. The photomask of claim 1 having two or more pairs of assist bars where each additional pair is spaced a multiple of the pitch of the first pair.

8. The photomask of claim 1 wherein the isolated and densely spaced features are lines.

9. The photomask of claim 1 wherein the isolated and densely spaced features are spaces.

10. In a photolithographic apparatus having an illuminator for directing light onto a photosensitive surface of a substrate, the improvement comprising a photomask for optically transferring a lithographic pattern corresponding to an integrated circuit (IC) from said mask onto a substrate, said pattern including a plurality of densely spaced features and an isolated feature spaced from the densely spaced features, said isolated feature having at least one pair of assist bars on opposite sides of said isolated feature and spaced equally from the corresponding side opposite the assist bar, wherein the assist bars alter the edge intensity gradient of edges of the isolated feature to reduce proximity effects, and wherein the assist bars are spaced such that the distance from the center of each assist bar to the center of an adjacent isolated feature is substantially equal to the pitch of the densely spaced features and a spatial frequency filter is disposed between the source of light and the photomask for distributing diffraction energy.

11. In a projection lithography apparatus with a light source, an illumination stage for shaping the light source, and a lens for directing the shaped light onto a photomask for projecting a pattern on the mask to a photosensitive surface of a substrate, a method for locating optical proximity correction features on the photomask comprising:

providing a set of densely spaced mask features on the photomask, said densely spaced features having a dense feature pitch;

providing one or more isolated features on the photomask;

locating one or more assist features adjacent the isolated features such that the distance from the center of each assist feature to the center of an adjacent isolated feature is substantially equal to the pitch of the densely spaced features.

12. The method of claim 11 wherein the assist features are sub-resolution in size, are placed on both sides of the isolated feature a distance so that their frequency distribution in the lens is cosinusoidal with the first node of the cosine above a frequency of zero coinciding with the frequency of the first diffraction order of the densely spaced features.

13. The method of claim 11 wherein the assist features have a width less than the incoherent diffraction limit of the lens.

14. The method of claim 11 wherein the width is less than 0.25 times the wavelength of the light source divided by the number aperture of the apparatus.

15. The method of claim 11 further comprising the step of spatially filtering the projected image of the photomask to attenuate the center of the pupil of the apparatus.

16. The method of claim 11 further comprising a second set of assist features located at twice the pitch of the first set of assist features.

17. The method of claim 16 further comprising a third set of assist features located at three times the pitch of the first set of assist features.

18. The method of claim 11 further comprising m sets of assist features wherein each set is located at m times the pitch of the first set of assist features.

19. In a projection lithography apparatus with a light source of known wavelength and a known numerical aperture, an illumination stage for shaping the light source, and a lens for directing the shaped light onto a photomask for projecting a pattern on the mask to a photosensitive surface of a substrate, a method for locating optical proximity correction features on the photomask comprising:

providing a set of densely packed mask features on the photomask, providing one of more isolated features on the photomask;

locating one or more assist features adjacent the isolated features a distance selected in accordance with the wavelength and numerical aperture such that the distance from the center of each assist feature to the center of an adjacent isolated feature is substantially equal to the pitch of the densely packed mask features.

20. The method of claim 19 wherein there are m sets of assist features and each set m of features is spaced a distance corresponding to the wavelength divided by the numerical aperture.

21. In a photomask for optically transferring a lithographic pattern corresponding to an integrated circuit (IC) from said photomask onto a substrate, said pattern including a plurality of densely spaced features and one or more semi-isolated features spaced from the densely spaced features, said isolated feature having at least one pair of assist bars on opposite sides of said isolated feature and spaced equally from the corresponding side of the isolated feature opposite the assist bar, wherein the assist bars alter the edge intensity gradient of edges of the isolated feature to reduce proximity effects, the improvement comprising:

spacing the assist bars such that the distance from the center of each assist bar to the center of an adjacent isolated feature is substantially equal to the pitch of the densely spaced features; and spacing the semi-isolated features at preferred duty ratios at odd multiples of the duty ratios of the densely spaced features.

22. The improvement of claim 21 wherein the preferred duty ratios include 1:3. 1:5 and 1:7.

23. In a projection lithography apparatus with a light source, an illumination stage for shaping the light source, and a lens for directing the shaped light onto a photomask for projecting a pattern on the mask to a photosensitive surface of a substrate, a method for locating optical proximity correction features on the photomask comprising:

providing a set of densely spaced features on the photomask, said densely spaced features having a dense feature pitch;

providing one of more isolated features on the photomask;

locating one or more assist features adjacent the isolated features a distance selected in accordance with the pitch of the densely spaced features such that the distance from the center of each assist bar to the center of an adjacent isolated feature is substantially equal to the pitch of the densely spaced features; and, illuminating the photomask with off-axis illumination.

24. In a photomask for optically transferring a lithographic pattern corresponding to an integrated circuit (IC) from said photomask onto a substrate, said pattern including a plurality of densely spaced features and an isolated feature spaced from the densely spaced features, said isolated feature having at least one pair of assist bars on opposite sides of said isolated feature and spaced equally from the corresponding side of the isolated feature opposite the assist bar, wherein the assist bars alter the edge intensity gradient of edges of the isolated feature to reduce proximity effects, the improvement comprising:

spacing the assist bars in accordance with the pitch of the densely spaced features, wherein the assist bars are spaced so that a first node of their diffraction cosine falls at the first diffraction order position of the densely spaced features.

25. In a photomask for optically transferring a lithographic pattern corresponding to an integrated circuit (IC) from said photomask onto a substrate, said pattern including a plurality of densely spaced features and an isolated feature spaced from the densely spaced features, said isolated feature having at least one pair of assist bars on opposite sides of said isolated feature and spaced equally from the corresponding side of the isolated feature opposite the assist bar, wherein the assist bars alter the edge intensity gradient of edges of the isolated feature to reduce proximity effects, the improvement comprising:

spacing the assist bars in accordance with the pitch of the densely spaced features, wherein the assist bars are spaced from the isolated feature a distance for generating a diffraction pattern having a cosine function with nodes that coincide with the first diffraction order of the densely spaced features.

26. In a projection lithography apparatus with a light source, an illumination stage for shaping the light source, and a lens for directing the shaped light onto a photomask for projecting a pattern on the mask to a photosensitive surface of a substrate, a method for locating optical proximity correction features on the photomask comprising:

providing a set of densely spaced features on the photomask, said densely spaced features having a dense feature pitch;

providing one of more isolated features on the photomask;

locating one or more assist features adjacent the isolated features a distance selected in accordance with the pitch of the densely spaced features, wherein the assist features are sub-resolution in size, are placed on both sides of the isolated feature a distance so that their frequency distribution in the lens is cosinusoidal with the first node of the cosine above a frequency of zero coinciding with the frequency of the first diffraction order of the densely spaced features.

27. A computer program product, comprising executable code transportable by at least one machine readable medium, wherein execution of the code by at least one programmable computer causes the at least one programmable computer to perform a sequence of steps for locating optical proximity correction features on a photomask, said sequence of steps comprising:

providing a set of densely spaced mask features on the photomask, said densely spaced features having a dense feature pitch;

providing one or more isolated features on the photomask;

locating one or more assist features adjacent the isolated features such that the distance from the center of each assist feature to the center of an adjacent isolated feature is substantially equal to the pitch of the densely spaced features.

28. A method for locating optical proximity correction features on a photomask for use with a projection lithography apparatus having a light source of known wavelength and a known numerical aperture, an illumination stage for shaping the light source, and a lens for directing the shaped light onto the photomask for projecting a pattern on the photomask to a photosensitive surface of a substrate, said method comprising:

providing one of more isolated features on the photomask; and locating one or more assist features adjacent the isolated features a distance selected in accordance with at least one of a given wavelength, numerical aperture and illumination condition such that defocus aberrations are minimized.

29. The method of claim 28 wherein there are m sets of assist features and each set m of features is spaced a distance corresponding to the wavelength divided by the numerical aperture.

30. A computer program product, comprising executable code transportable by at least one machine readable medium, wherein execution of the code by at least one programmable computer causes the at least one programmable computer to perform a sequence of steps for locating optical proximity correction features on a photomask, said sequence of steps comprising:

providing one of more isolated features on the photomask; and locating one or more assist features adjacent the isolated features a distance selected in accordance with at least one of a given wavelength, numerical aperture and illumination condition such that defocus aberrations are minimized.

31. The computer program product of claim 30, wherein there are m sets of assist features and each set m of features is spaced a distance corresponding to the wavelength divided by the numerical aperture.

* * * * *